United States Patent [19]

Carruthers et al.

[11] Patent Number: 5,285,099
[45] Date of Patent: Feb. 8, 1994

[54] SICR MICROFUSES

[75] Inventors: Roy A. Carruthers, Stormville; Fernand J. Dorleans, Wappinger Falls; John A. Fitzsimmons; Richard Flitsch, both of Poughkeepsie; James A. Jubinsky, Clinton Corners; Gerald R. Larsen, Cornwall; Geraldine C. Schwartz; Paul J. Tsang, both of Poughkeepsie; Robert W. Zielinski, Wappinger Falls, all of N.Y.

[73] Assignee: International Business Machines Corporation, Armonk, N.Y.

[21] Appl. No.: 990,679

[22] Filed: Dec. 15, 1992

[51] Int. Cl.$^5$ .......... H01L 27/02; H01L 23052844651; H01L 29/46
[52] U.S. Cl. .................... 257/529; 257/537; 257/734; 257/763; 257/765; 257/751
[58] Field of Search .............. 257/734, 763, 765, 771, 257/784, 751, 529, 537

[56] References Cited

U.S. PATENT DOCUMENTS 4,951,118 8/1993 Nakamura .......................... 257/538

Primary Examiner—Jerome Jackson
Assistant Examiner—Valencia M. Wallace
Attorney, Agent, or Firm—Harold Huberfeld

[57] ABSTRACT

A SiCr microfuse, deletable either by electrical voltage pulses or by laser pulses, for rerouting the various components in an integrated circuit, as where redundancy in array structures is implemented, and the method of fabricating same, at any wiring level of the chip, by utilizing a direct resist masking of the SiCr fuse layer to eliminate problems of mask damage and residual metal adjacent the fuse.

4 Claims, 4 Drawing Sheets

SICR MICROFUSES

BACKGROUND OF THE INVENTION

1. Field of the Invention

The present invention generally relates to the fabrication of microfuses within a semiconductor structure and, more specifically, to the structure and process of fabricating a SiCr microfuse within an integrated circuit (IC) which would be deletable by either a low voltage electrical pulse or a laser pulse. Such fuses are typically used for rerouting the various components of the IC, especially where redundancy in array structures is implemented.

2. Description of the Prior Art

Microfuses have been receiving considerable attention and gaining popularity in ultra large scale integrated (ULSI) circuit fabrication for implementing redundancy, particularly in the areas of bipolar and complementary metal oxide semiconductor (BICMOS) field effect transistor (FET) semiconductor chip manufacturing. Conventional microfuses presently used in the industry are deletable only by laser, and no electrical blowable microfuses integrated within a ULSI circuits are known to exist.

In the early stages of SiCr fuse development work, a SiCr resistor fabrication process was used for the SiCr fuse fabrication, but major difficulties arose in using this approach. In the resistor fabrication process, Al was used as the mask for the reactive ion etching (RIE) step of the SiCr in a batch reactor. In transferring this resistor fabrication process to a fuse fabrication process, in which single wafer RIE systems are used, defects were observed in the Al mask that were replicated in the SiCr. These defects appeared to be caused by electrical discharge in the single-wafer RIE system. In the resistor fabrication program, the final metal layer (LM) was wet etched. Wet Al etchant does not attack SiCr, and no provision is needed to protect SiCr during etching of the LM layer. This particular fabrication method requires delineation of LM by RIE in a chlorinated plasma which attacks SiCr; therefore, an etch stop layer is added to the fuse material stack to protect the SiCr during the final stage of LM RIE. Another major shortcoming of the resistor-like process that uses an Al etch mask is that, for some unknown reason, cones of residual Al-based metal were left routinely adjacent to the SiCr fuses if LM is etched by RIE, but none were seen in the sub-etched area when this particular fabrication process is used to fabricate the SiCr fuses.

The major deficiencies encountered in the prior art are that the known microfuses are deletable only by laser pulses, and in the fabrication process, damage to the AL mask invariably occurs during the RIE step and residual metal (Al) remains next to the fuse.

SUMMARY OF THE INVENTION

It is therefore an object of the present invention to provide a microfuse integratable into a semiconductor ULSI circuit structure that will be deletable by low voltage electrical pulses and laser pulses.

It is another object of this invention to provide a method of fabricating a SiCr microfuse without incurring mask damage during the RIE step of the mask and without leaving a residual metal adjacent to the fuse.

According to this invention, there is provided a method of fabricating a unique SiCr microfuse structure with a contact structure that makes the fuse deletable (blowable) by low voltage electrical pulses or by laser pulses.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
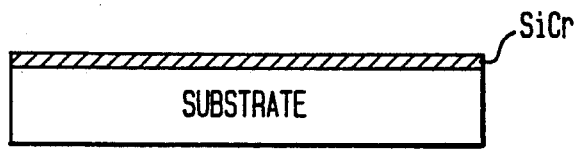
FIGS. 1 through 17 illustrate the fabrication process to place the microfuse at a selected level of the semiconductor structure.

Referring now to the drawings, it is seen that the invention is described in terms of fabricating a SiCr thin film fuse which is deletable by laser or by an electrical pulse supportable by bipolar and CMOS/BICMOS ICs.

One of the major reasons that the SiCr thin film is chosen for fabricating the microfuse is because of the unique electrical and optical properties of the SiCr material. The SiCr film has an electrical conductivity that is high enough to allow a fuse to serve as an inter-circuit linkage during normal circuit operations, but is low enough for the fuse to be blowable by a voltage pulse whose magnitude is compatible with the IC circuit. At the same time, the SiCr film has a fairly high infrared (IR) absorbent characteristic, thus making the fuse also blowable by an IR laser.

For an electrically deletable fuse, the fuse can be placed at any wiring level of the chip as long as it is placed more than 1.0 μm away from the Si substrate. For a laser deletable fuse, it is preferable to place the fuse at the last metal (LM) level.

Referring now specifically to FIG. 1, the first steps of fabrication in the Resist-Mask SiCr fuse process involves the preparation of a suitable substrate, such as Si, whether it be a substrate wafer or an insulative layer of a particular IC structure upon which it is desired to fabricate a microfuse. The surface of the substrate is cleaned, for instance, in a BHF bath, then in-situ sputter cleaned, followed by the sputter deposition of a SiCr film (the fuse material), approximately 30 to 100 nm, and preferably in the range of 35 to 65 nm in thickness and from a target composed of approximately 28% Cr and 72% Si. The film is amorphorous as deposited. It transforms to polycrystalline after being annealed at or above 280° C. for 30 minutes or longer. The polycrystalline film consists of chromium disilicide ($CrSi_2$) supersaturated with Si solute atoms.

Figure 2:
Figure 3:
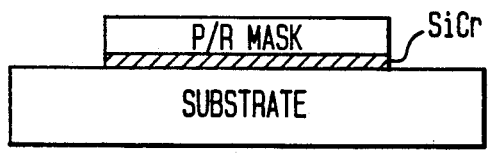
Figure 4:
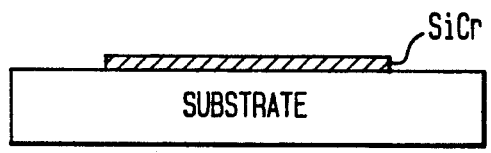
Figure 5:
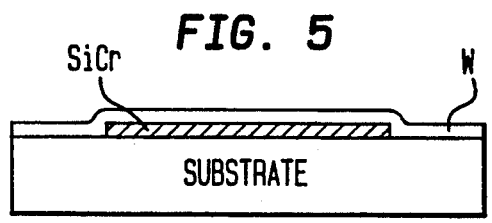

Looking now at FIG. 2, a fuse pattern is defined on the surface of the SiCr layer using a standard photolithographic procedure. As seen in FIG. 3, the exposed surface of the SiCr layer is etched away using a reactive ion etching (RIE) technique in an $O_2/CF_4$ mixture to end point with a sufficient overetch to compensate film/reactor non-uniformities. The photoresist is then removed, as shown in FIG. 4. One of the best processes to remove the residual resist, and leave the SiCr surface unaltered, is by the immersion of the structure in a hot IBM NMP-TMAH stripper solution (as described in U.S. Pat. No. 5,091,103) followed by drying. The wafer is then subjected to a brief, low power ash in a single wafer asher (e.g., Tegal 900). Typical ashing conditions are 1.5 Torr $O_2$ at 100 Watts for 20 seconds. An alternative way to remove the residual resist is by $O_2$ ashing in an asher in which the wafer is not excessively heated and/or subjected to sputtering during ashing, such as a Tegal barrel asher, followed by a dip-clean in dilute AZ developer.

Upon removing the photoresist layer of FIG. 3, the SiCr fuse layer is sputter cleaned by removing about 1.5-5.0 nm of the SiCr surface material, then a layer of about 50-200 nm, preferably 100 nm, of tungsten (W) is in-situ deposited thereon, completely covering the surface of the wafer. Now the final metallization layer (LM), of an aluminum alloy, for example, the Ti/AlCu/Ti/AlCu alloy, called TACTAC, is deposited by sputtering over the entire surface of the Tungsten layer, as shown in FIG. 6.

Figure 6:
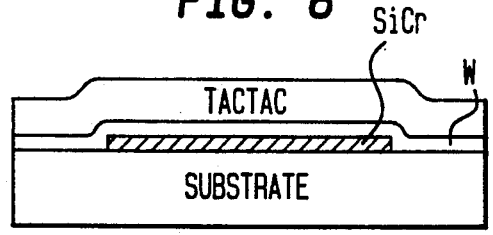
Figure 7:
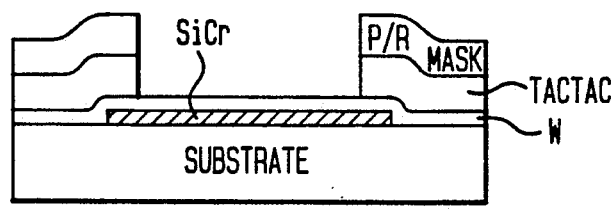

Again using a standard photolithographic procedure, the final metal pattern is defined on the surface of the Al alloy of FIG. 6 and etched by RIE, as shown in FIG. 7, with the tungsten layer, W, acting as the etch stop layer. Now the residual LM resist is stripped by the standard technique, and the exposed tungsten layer, W, outside the LM interconnections is etched and removed from the surface of the fuse, in a $CF_4$ plasma to endpoint plus a small overetch to compensate for film/reactor non-uniformities. The RIE condition will depend on the reactor used.

Figure 8:
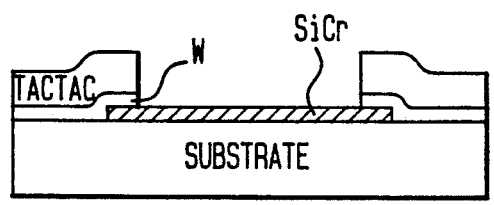
Figure 9:
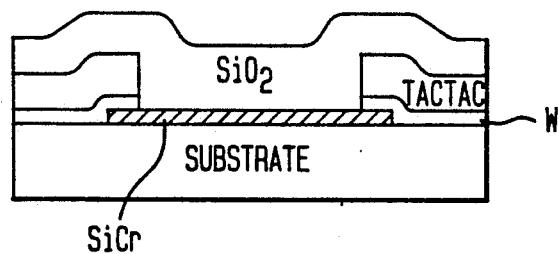

The structure of FIG. 8 is now annealed at a temperature in the range of 350°-450° C. for a period of 30-90 minutes, after which the final passivation layer of $SiO_2$ of about 3-4 μm thickness is deposited over the entire surface of the structure, as seen in FIG. 9. If it is required by the IC, this annealing step can be postponed until the completion of the final passivation layer of $SiO_2$.

Figure 10:
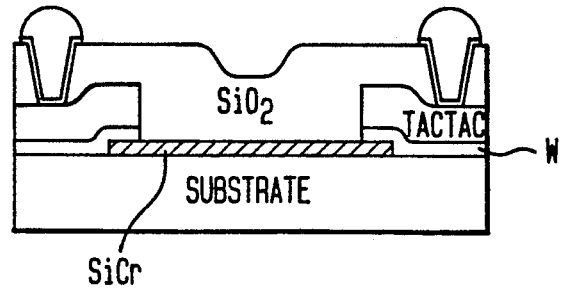

As shown in FIG. 10, the IC chip is now completed by providing C-4 contacts of PbSn or bonded wires.

The starting material stack, i.e., the SiCr-W-LM stack, the finished SiCr fuse with W contact barrier, and the above described fuse fabrication procedure, are unique and novel in SiCr microfuse fabrication. They enable the final metal to be etched by RIE to attain ultrahigh density, and make the fuse/LM fabrication process a mass-production manufacturing process.

Figure 11:
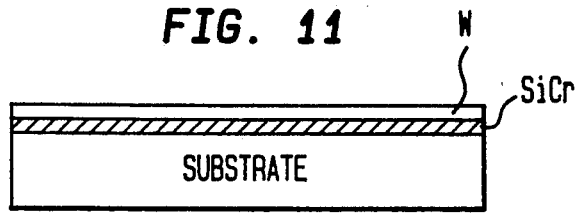
Figure 12:
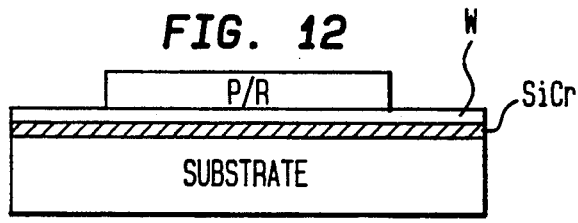
Figure 13:
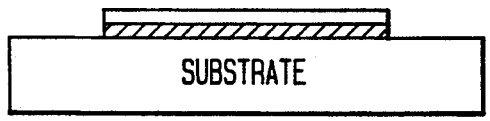
Figure 14:
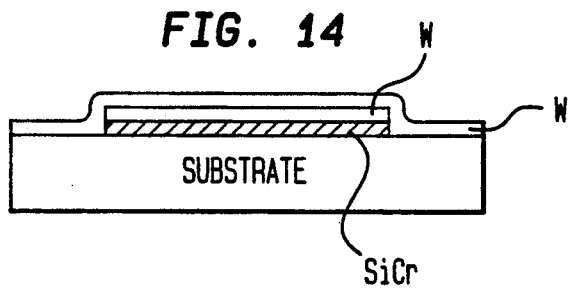

The above described Resist-Mask process can be modified to suit certain tool set. This modified process, called W-capped SiCr fuse process, is described in FIGS. 11 through 17. Note that in FIG. 11, the SiCr/W stack is grown on a selected substrate, and then in FIG. 12, a fuse photoresist pattern is deposited on the surface of the stack, followed by an RIE step to remove the W and SiCr materials not protected by the photoresist mask. In this step, the W layer is in-situ etched by RIE in the same $O_2/CF_4$ plasma used for the SiCr fuse. The residual resist is removed by $O_2$ ash in an asher that has a weak resputter component (e.g., a barrel asher), followed by a dilute AZ developer final clean. The W surface of FIG. 13, is now sputter-cleaned by removing about 5.0-10.0 nm of the W surface and then a layer of W material is in-situ sputter deposited, to a depth of about 50-200 nm, over the entire exposed surface of the stack, as seen in FIG. 14. Preferably the thickness of the layer of W material falls within 70-150 nm range.

Figure 15:
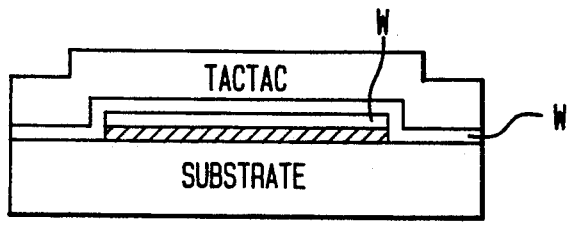
Figure 16:
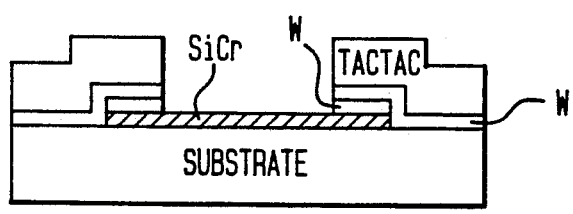
Figure 17:
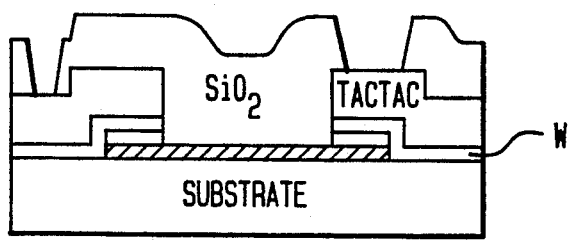

As shown in FIG. 15, the final metal layer such as a Ti/AlCu/Ti/AlCu alloy, called TACTAC, is sputter grown, and FIG. 16 shows the delineation of the final metal in the selected areas and the removal of the W layer over the SiCr fuse in a $CF_4$ plasma RIE. In the final metal RIE the W layer acts as its etch-stop barrier. FIG. 17 shows the annealing of the formed fuse structure with a final passivation layer deposited thereon.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. A microfuse structure fabricated within an integrated circuit (IC) which is deletable by either a low voltage electrical pulse or a laser pulse comprising:
    a substrate with a SiCr fuse deposited thereon having a target composition of approximately 28% Cr and 72% Si, said SiCr fuse being etched to a defined size and shape;
    a first layer of tungsten, W, having a thickness of between 50-200 nm and a layer of an aluminum (Al) alloy deposited over said SiCr fuse said W layer and Al alloy layer being etched to expose the SiCr fuse surface;
    a passivation layer deposited over the microfuse structure to a thickness of about 3.0 to 4.0 μm; and electrical contacts provided through said passivation layer to said Al alloy layer.

2. The microfuse structure of claim 1 wherein said Al alloy is a Ti/AlCu/Ti/AlCu alloy.

3. The microfuse structure of claim 1 wherein the thickness of the first W layer is approximately 100 nm.

4. The microfuse structure of claim 1 further comprising an intermediary W layer between said first W layer and the SiCr fuse, said intermediary W layer being initially etched to the size and shape of the microfuse and therafter being etched with said first W layer and said Al alloy layer to expose the SiCr fuse surface.

* * * * *